(12) United States Patent
Oosterlaken

(10) Patent No.: US 12,027,400 B2
(45) Date of Patent: Jul. 2, 2024

(54) AUTOMATIC SYSTEM CALIBRATION FOR WAFER HANDLING

(71) Applicant: ASM IP Holding B.V., Almere (NL)

(72) Inventor: Theodorus G. M. Oosterlaken, Oudewater (NL)

(73) Assignee: ASM IP Holding B.V., Almere (NL)

( * ) Notice: Subject to any disclaimer, the term of this patent is extended or adjusted under 35 U.S.C. 154(b) by 635 days.

(21) Appl. No.: 17/326,533

(22) Filed: May 21, 2021

(65) Prior Publication Data

US 2021/0375654 A1 Dec. 2, 2021

Related U.S. Application Data

(60) Provisional application No. 63/029,836, filed on May 26, 2020.

(51) Int. Cl.
*H01L 21/677* (2006.01)
*H01L 21/67* (2006.01)

(52) U.S. Cl.
CPC .. *H01L 21/67763* (2013.01); *H01L 21/67259* (2013.01); *G05B 2219/39024* (2013.01); *G05B 2219/39527* (2013.01); *G05B 2219/40555* (2013.01)

(58) Field of Classification Search
CPC ........ H01L 21/67763; H01L 21/67259; G05B 2219/39024; G05B 2219/39527; G05B 2219/40555
See application file for complete search history.

(56) References Cited

U.S. PATENT DOCUMENTS

| | | | | |
|---|---|---|---|---|
| 6,085,125 A | * | 7/2000 | Genov | H01L 21/681 414/744.1 |
| 6,388,436 B1 | * | 5/2002 | Nodot | H01L 21/681 324/750.02 |
| 7,158,857 B2 | * | 1/2007 | Schauer | H01L 21/67265 700/218 |
| 7,233,841 B2 | * | 6/2007 | Sadighi | B25J 9/1697 348/94 |
| 7,933,685 B1 | * | 4/2011 | Sarver | H01L 21/68 414/229 |
| 10,002,781 B2 | * | 6/2018 | Moura | H01L 21/67294 |
| 10,062,593 B2 | * | 8/2018 | Kuwahara | H01L 21/67253 |
| 10,276,417 B2 | * | 4/2019 | Wang | H01L 23/544 |
| 10,790,237 B2 | * | 9/2020 | Mooring | H01L 21/67259 |
| 11,380,565 B2 | * | 7/2022 | Kim | B25J 9/1692 |
| 2003/0060922 A1 | * | 3/2003 | Schauer | H01L 21/67265 700/213 |
| 2003/0135302 A1 | * | 7/2003 | Hung | H01L 21/68707 700/245 |

(Continued)

*Primary Examiner* — Kyle O Logan
(74) *Attorney, Agent, or Firm* — Snell & Wilmer L.L.P.

(57) ABSTRACT

A method for automatically calibrating the position of a wafer handling robot relative to a wafer carrier. The method comprises providing a semiconductor processing assembly comprising the wafer carrier and the wafer handling robot having an end effector, placing a wafer on a wafer support surface of the end effector, moving the end effector to an end position adjacent the wafer carrier, determining a displacement of the wafer on the wafer support surface, repeating these steps until the magnitude of the displacement meets a set end criterion, and storing the latest used end position as a calibrated end position.

17 Claims, 6 Drawing Sheets

(56) References Cited

U.S. PATENT DOCUMENTS

2004/0151574 A1* 8/2004 Lu ..................... H01L 21/681
    414/936
2004/0258514 A1* 12/2004 Raaijmakers ......... H01L 21/681
    414/800
2019/0049865 A1* 2/2019 Kuwahara ........... G03F 7/70141

* cited by examiner

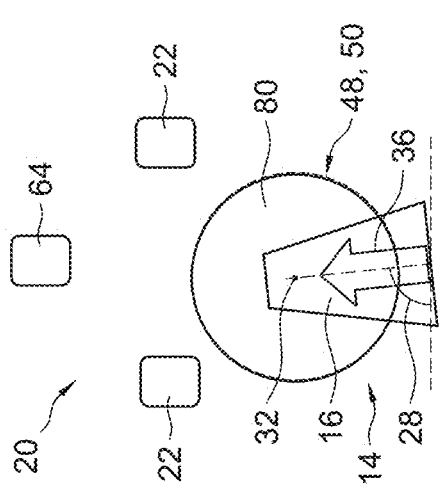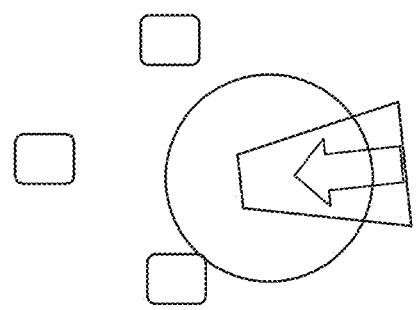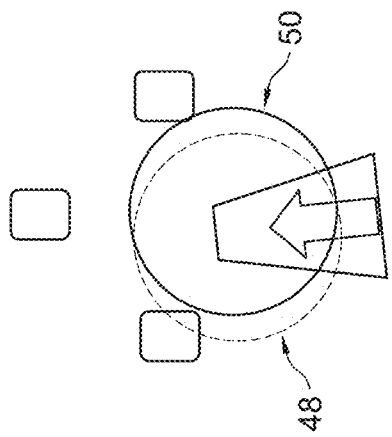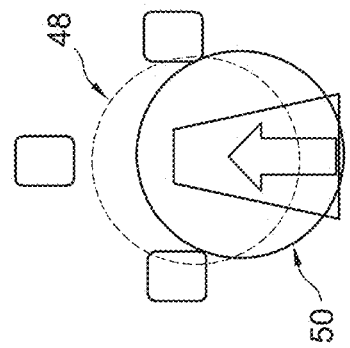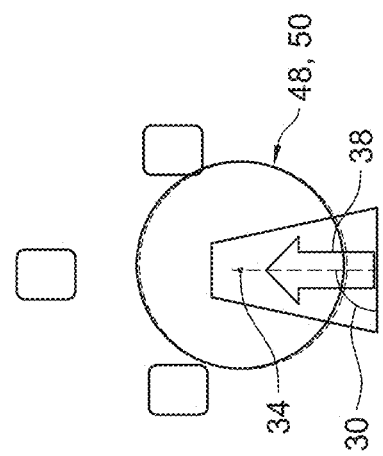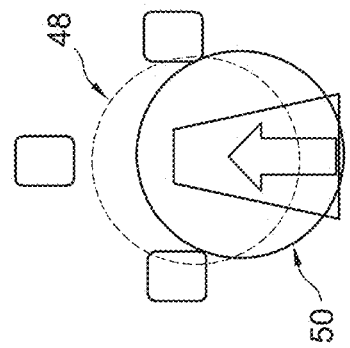

AUTOMATIC SYSTEM CALIBRATION FOR WAFER HANDLING

CROSS-REFERENCE TO RELATED APPLICATIONS

This application claims priority to U.S. Provisional Patent Application Ser. No. 63/029,836 filed May 26, 2020 entitled "AUTOMATIC SYSTEM CALIBRATION FOR WAFER HANDLING," the disclosure of which is hereby incorporated by reference in its entirety.

FIELD OF THE DISCLOSURE

The present disclosure generally relates to a method for automatically calibrating the position of a wafer handling robot relative to a wafer carrier, and to a semiconductor processing assembly.

BACKGROUND

Most semiconductor processing assemblies may be provided with a wafer handling robot for transporting wafers between wafer carriers. Such a wafer handling robot may be configured for precisely placing a wafer in a slot of one such wafer carrier. In order to avoid damage to the wafer, e.g. by bumping against parts of the wafer carrier, the position of the wafer handling robot relative to the wafer carrier may be precisely calibrated.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It is realized that the calibration of a wafer handling robot with respect to a wafer carrier may need to be very accurate.

It is realized that after each time a semiconductor processing assembly is opened, e.g. for maintenance of said wafer handling robot, a previously known calibration may not be able to place a wafer in the wafer carrier without causing damage to the wafer.

It is realized that a manual calibration of the wafer handling robot may be a lengthy and strenuous activity, for which expert knowledge may be needed.

Therefore, it may be an object to provide a method for automatically calibrating the position of a wafer handling robot relative to a wafer carrier.

To that end, there may be provided a method according to claim 1. More particularly, there may be provided a method for automatically calibrating the position of a wafer handling robot relative to a wafer carrier.

The method may comprise:
i) providing a semiconductor processing assembly. The semiconductor processing assembly may comprise:
  a wafer handling robot having an end effector having a wafer support surface configured to carry a wafer;
  a wafer center finder configured to determine the center of a wafer which is placed on the end effector;
  a wafer carrier relative to which the position of the wafer handling robot has to be calibrated, the wafer carrier having wafer slots; and,
  an electronic controller for controlling at least the wafer handling robot and the wafer center finder and having a system memory.

For calibrating the wafer handling robot relative to the wafer carrier in a horizontal plane, the following method steps may be automatically performed under control of the electronic controller of the semiconductor processing assembly:
  ii) placing a wafer in a start position on the wafer support surface of the end effector such that the wafer can be displaced over the wafer support surface when a lateral force is exerted on the wafer;
  iii) moving the end effector with the wafer to the wafer center finder and determine with the wafer center finder a determined position of the wafer relative to the end effector;
  iv) repeating the following horizontal calibration cycle of steps a) to d) until a set end criterion is met at least a number of cycles:
    a) determine on the basis of the determined position of the wafer relative to the end effector a defined entry angle of a movement path and a defined end position of the movement path of the end effector, wherein the defined end position is adjacent the wafer carrier;
    b) move the end effector with the wafer on its wafer support surface to the defined end position along the movement path with the defined entry angle;
    c) determine with the wafer center finder the position of the wafer relative to the end effector; and,
    d) check whether, due to the movement of the end effector along the movement path to the defined end position, the position of the wafer relative to the end effector has been displaced and whether a magnitude of the displacement meets the set end criterion, wherein, if the magnitude does not meet the set criterion, a subsequent cycle of steps a) to d) is performed, and wherein, if the magnitude does meet the set criterion at least a number of cycles, the method is continued at v);
  v) storing the entry angle and the end position which has been determined in the last cycle in the system memory as calibrated entry angle and calibrated end position for a calibrated movement path of the wafer handling robot relative to the respective wafer carrier.

There may also be provided a semiconductor processing assembly according to claim 11. More particularly, there may be provided a semiconductor processing assembly comprising:
  a wafer handling robot having an end effector having a wafer support surface configured to carry a wafer (wafer);
  a wafer center finder configured to determine a center of a wafer which is placed on the end effector;
  a wafer carrier relative to which the position of the wafer handling robot has to be calibrated, the wafer carrier having wafer slots; and,
  an electronic controller for controlling at least the wafer handling robot and the wafer center finder and having a system memory;

For calibrating the wafer handling robot relative to the wafer carrier in a horizontal plane, the electronic controller may be configured and programmed with a program in its system memory to control the semiconductor processing assembly to automatically:
  i) place a wafer in a start position on the wafer support surface of the end effector such that the wafer can be displaced over the wafer support surface when a lateral force is exerted on the wafer;

ii) move the end effector with the wafer to the wafer center finder and determine with the wafer center finder a determined position of the wafer relative to the end effector;

iii) repeat the following horizontal calibration cycle of steps a) to d) until a set end criterion is met at least a number of cycles:

a) determine on the basis of the determined position of the wafer relative to the end effector a defined entry angle of a movement path and a defined end position of the movement path of the end effector, wherein the defined end position is adjacent the wafer carrier;

b) move the end effector with the wafer on its wafer support surface to the defined end position along the movement path with the defined entry angle;

c) determine with the wafer center finder the position of the wafer relative to the end effector; and, d) check whether, due to the movement of the end effector along the movement path to the defined end position, the position of the wafer relative to the end effector has been displaced and whether a magnitude of the displacement meets the set end criterion, wherein, if the magnitude does not meet the set criterion, a subsequent cycle of steps a) to d) is performed, and wherein, if the magnitude does meet the set criterion at least a number of cycles, the method is continued at iv);

iv) store the entry angle and the end position which has been determined in the last cycle in the system memory as calibrated entry angle and calibrated end position for a calibrated movement path of the wafer handling robot relative to the respective wafer carrier.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

Various embodiments are claimed in the dependent claims, which will be further elucidated with reference to an example shown in the figures. The embodiments may be combined or may be applied separate from each other.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

FIGS. 5-10 show a schematic top view of a wafer carrier and an end effector with a wafer on its wafer support surface according to the description, which end effector is moving toward the wafer carrier along different movement paths;

DETAILED DESCRIPTION OF THE FIGURES

In this application similar or corresponding features are denoted by similar or corresponding reference signs. The description of the various embodiments is not limited to the example shown in the figures and the reference numbers used in the detailed description and the claims are not intended to limit the description of the embodiments, but are included to elucidate the embodiments.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "wafer" may refer to any underlying material or materials that may be used, or upon which, a device, a circuit, or a film may be formed.

Figure 2:
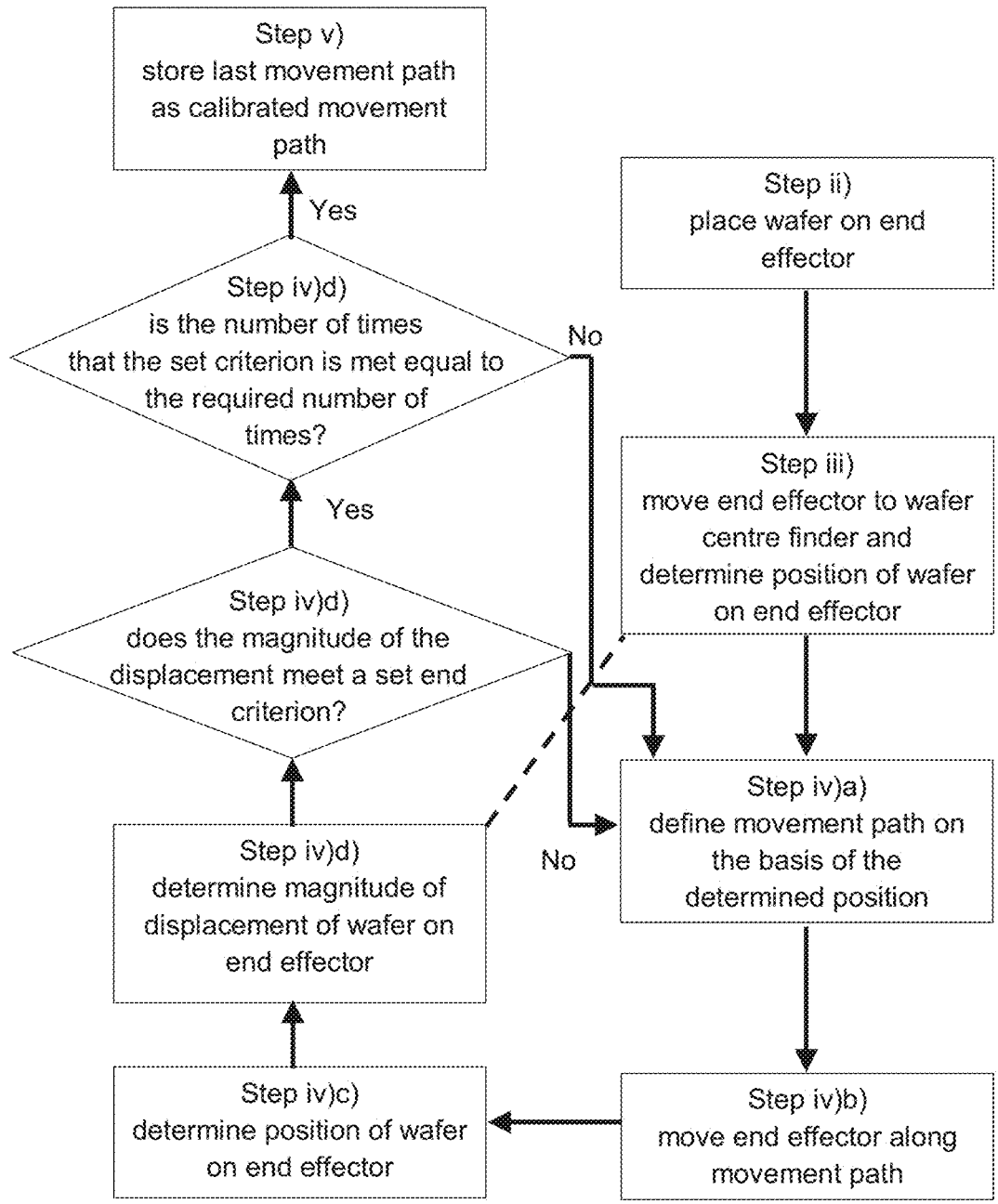
FIG. 2 shows a schematic representation of an example of a method according to the description.

In the most general terms, the present disclosure may provide a method for automatically calibrating the position of a wafer handling robot 12 relative to a wafer carrier 20, 40. A schematic representation of an example of the method is shown in FIG. 2. The method may comprise:

i) providing a semiconductor processing assembly 10. The semiconductor processing assembly 10 may comprise:

a wafer handling robot 12 having an end effector 14 having a wafer support surface 16 configured to carry a wafer 80;

a wafer center finder 18 configured to determine the center of a wafer 80 which is placed on the end effector 14;

a wafer carrier 20, 40 relative to which the position of the wafer handling robot 12 has to be calibrated, the wafer carrier 20, 40 having wafer slots 46; and, an electronic controller 24 for controlling at least the wafer handling robot 12 and the wafer center finder 18 and having a system memory 26;

For calibrating the wafer handling robot 12 relative to the wafer carrier 20, 40 in a horizontal plane, the following method steps may be automatically performed under control of the electronic controller 24 of the semiconductor processing assembly 10:

ii) placing a wafer 80 in a start position 48 on the wafer support surface 16 of the end effector 14 such that the wafer 80 can be displaced over the wafer support surface 16 when a lateral force is exerted on the wafer 80;

iii) moving the end effector 14 with the wafer 80 to the wafer center finder 18 and determine with the wafer center finder 18 a determined position 50 of the wafer 80 relative to the end effector 14;

iv) repeating the following horizontal calibration cycle of steps a) to d) until a set end criterion is met at least a number of cycles:

a) determine on the basis of the determined position 50 of the wafer 80 relative to the end effector 14 a defined entry angle 28 of a movement path 36 and a defined end position 32 of the movement path 36 of the end effector 14, wherein the defined end position 32 is adjacent the wafer carrier 20, 40;

b) move the end effector 14 with the wafer 80 on its wafer support surface 16 to the defined end position 32 along the movement path 36 with the defined entry angle 28;

c) determine with the wafer center finder 18 the position 50 of the wafer relative to the end effector 14; and, d) check whether, due to the movement of the end effector 14 along the movement path 36 to the defined end position 32, the position 48, 50 of the wafer 80 relative to the end effector 14 has been displaced and whether a magnitude of the displacement meets the set end criterion, wherein, if the magnitude does not meet the set criterion, a subsequent cycle of steps a) to d) is performed, and wherein, if the magnitude does meet the set criterion at least a number of cycles, the method is continued at v);

v) storing the entry angle 28 and the end position 32 which has been determined in the last cycle in the system memory 26 as calibrated entry angle 30, 31 and calibrated end position 34, 35 for a calibrated movement path 38 of the wafer handling robot 12 relative to the respective wafer carrier 20, 40.

By executing the method of the description automatically, the calibration of the position of the wafer handling robot 12 relative to the wafer carrier 20, 40 may be done swiftly and reliably by the semiconductor processing assembly 10 itself, without the need for manual calibration. This may not only decrease the time needed for calibration, but may also increase the accuracy of the calibration. The method may do so by the features described in this description.

The method according to the description may automatically calibrate the position of the wafer handling robot 12 relative to the wafer carrier 20, 40 by probing the wafer carrier 20, 40 to find the position of said wafer carrier 20, 40. The calibration cycle steps a)-d) are used to move the end effector 14 increasingly closer to the wafer carrier 20, 40.

There may be a general indication of the geometry of the wafer carrier 20, 40, as well as the relative placement of the wafer handling robot 12 relative to the wafer carrier 20, 40. This indication may stem from a previous calibration, or may be manually given to the semiconductor processing assembly 10. The general indication about the geometry of the wafer carrier 20, 40 may comprise the type of wafer carrier 20, 40 and the placement of wafer slots 46 in that wafer carrier 20, 40. The wafer carrier 20 may be e.g. a wafer boat 20, in which the wafer slots 46 are situated between two front rails 22. It may also be a wafer cassette 40, such as a FOUP, in which the wafer slots 46 are situated between the two sides. It may also be an intermediate wafer storage, also called a wafer rack, in which the wafer slots 46 are situated between two front rails.

The general indication of the geometry of the wafer carrier 20, 40, as well as the relative placement of the wafer handling robot 12 relative to the wafer carrier 20, 40 may be used to calculate the defined end position 32 and defined entry angle 28 of the movement path 36 towards which end position 32 the end effector 14 may be moved. If the wafer carrier 20, 40 is e.g. a wafer boat 20 having three rails 22, 64 as schematically shown FIGS. 5-9, a suitable movement path may be straight and in the middle between the two front rails 22 of the wafer boat 20. If the movement path is not straight or not exactly in the middle between the two front rails 22, the wafer 80 may bump into one of the two front rails 22, causing the wafer 80 to displace on the wafer support surface 16 of the end effector 14. This displacement may provide information about the actual position of the wafer carrier 20, 40 relative to the wafer handling robot 12. If e.g. the left front rail 22 is bumped onto, the wafer 80 may have a displacement to the right. Also the ratio between the perpendicular and parallel displacement with respect to the movement path 35 may be an indication of the relative position of the front rails 22, and thus the wafer carrier 20, 40 in general, and the end effector 14 in particular, and thus the wafer handling robot 12.

In each calibration cycle the defined entry angle 28 and the defined end position 32 are based on the determined position 50 of the wafer 80 relative to the end effector 14 at the end of the previous calibration cycle. If the determined position 50 was unexpected, e.g. because the left front rail 22 of the wafer carrier 20, 40 was bumped onto, as shown in FIG. 7, the defined end position 32 in the subsequent calibration cycle may be more to the right. Or if e.g. the perpendicular displacement with respect to the movement path 35 of the determined position 50 with respect to the start position 48 is less than would be expected from the previous calibration cycle, the defined entry angle 28 in the subsequent calibration cycle may be adjusted accordingly.

After each calibration cycle the position of the wafer carrier 20, 40 will be better known. The method will repeat the horizontal calibration cycle until the magnitude of the displacement of the wafer 80 relative to the end effector 14, due to the movement of the end effector 14 along the movement path 36 to the defined end position 32, meets the set end criterion. A set end criterion may thus be an expected displacement of the wafer 80 relative to the end effector 14. If e.g. the wafer 80 is expected to abut the two front rails 22 of the wafer boat 20 simultaneously when the end effector 14 is in a certain defined end position 32, the end effector 14 may be moved a short distance beyond that defined end position 32, as is shown in FIG. 10. The wafer 80 may than be expected to move over the wafer supporting surface 18 by that distance parallel to the movement path 36 of the end effector 14. The set end criterion is met as that expected displacement is indeed determined in the following step iv) d). Other set end criterions may include for example that the magnitude of the displacement is less than a certain value or for example that the magnitude of the displacement is equal to zero.

Although the operation of the method is explained on the basis of a wafer boat 20, it may be clear to the skilled person that it may also be carried out using a wafer cassette 40 or intermediate wafer storage and the general indications of the geometry of that respective wafer carrier 20, 40.

The wafer center finder 18 may be configured to detect the center of a wafer 80 using known techniques. An example of such a technique is described in U.S. Pat. No. 5,768,125 in the name of Zinger and of which the subject matter is incorporated herein by reference. By comparing the determined position 50 measured by the wafer center finder 18 with the start position 48 of the wafer 80 on the end effector 14 or alternatively with a determined wafer position of the wafer 80 which has been determined in a previous cycle, the displacement of the wafer 80 on the end effector 14 in the present horizontal calibration cycle may be determined.

Figure 3:
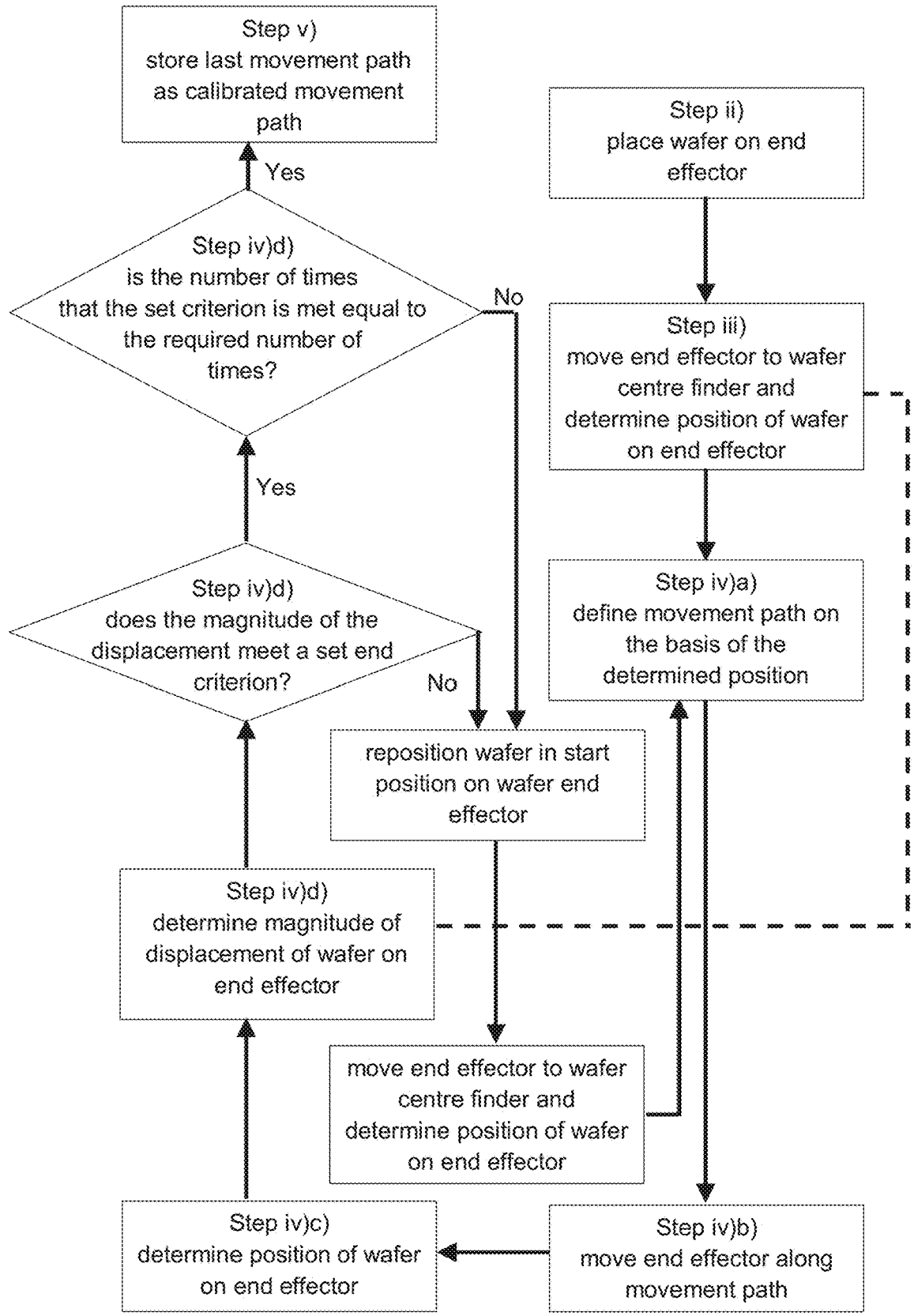
FIG. 3 shows a schematic representation of an example of an embodiment of the method according to the description.
Figure 4:
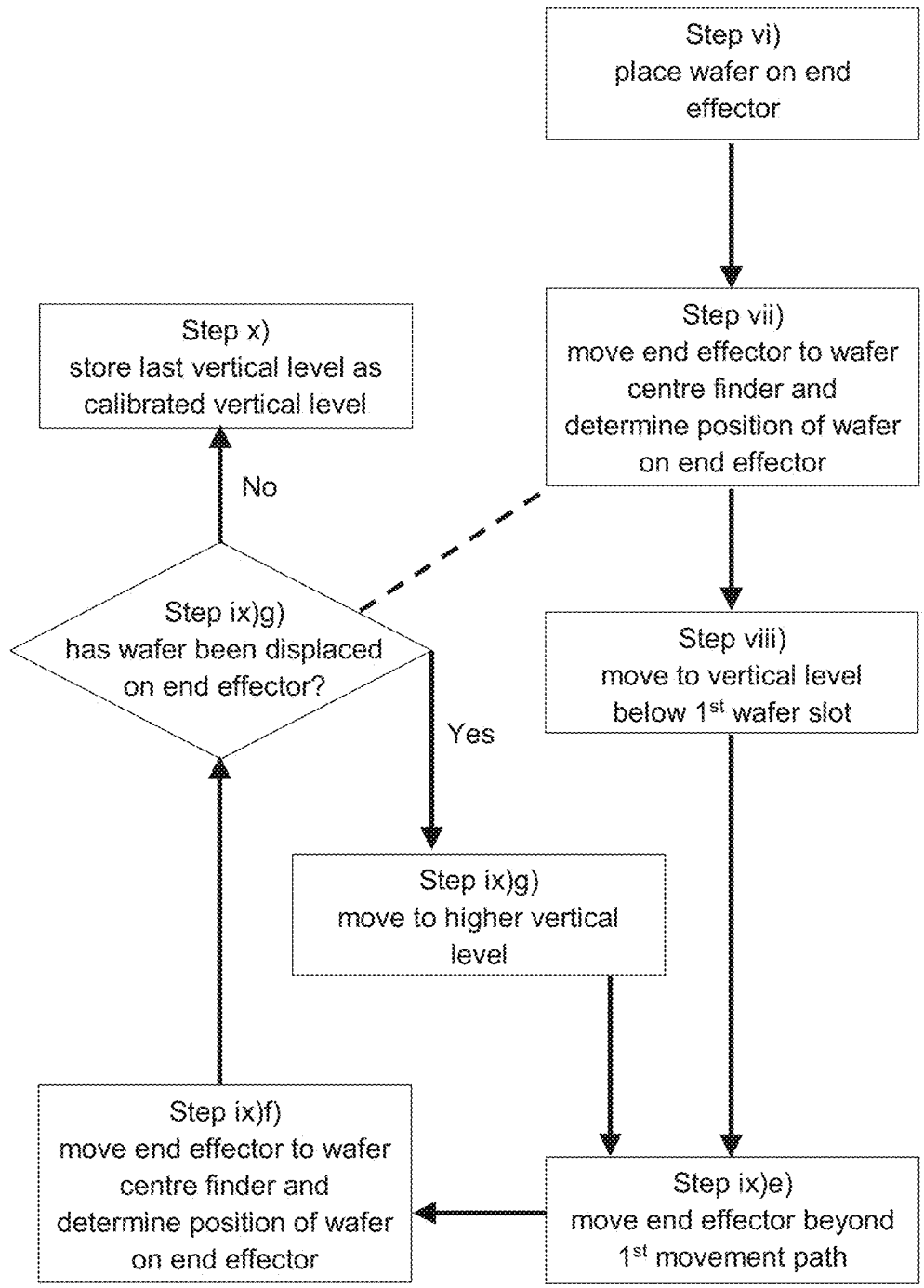
FIG. 4 shows a schematic representation of an example of an embodiment of the method according to the description.

In an embodiment, schematically shown in FIG. 3, when step d) is performed and it is established that a subsequent horizontal calibration cycle has to be performed, the method may comprise, before the next horizontal calibration cycle of steps a) to d) is performed, repositioning the wafer 80 on the end effector 14 in the start position 48, and moving the end effector 14 with the wafer 80 to the wafer center finder 18 to determine with the wafer center finder 18 a determined position 50 of the wafer 80 relative to the end effector 14.

By repositioning the wafer 80 after each horizontal calibration cycle into the start position 48, it may be prevented that the wafer 80 may be displaced too far from the center of the end effector 14 due to the superimposed displacements in the plurality of subsequent horizontal calibration cycles.

In an embodiment the wafer slots 46 of the wafer carrier 20, 40 may be substantially horizontal. The defined end position 32 of the movement path 36 adjacent the wafer carrier 20, 40 may be at a vertical level of the wafer carrier 20, 40 wherein no wafer slots 46 are present and wherein the calibrated end position 34, 35 is a first calibrated end position 34 and the calibrated entry angle 30, 31 is a first calibrated entry angle 30 which are related to the exact position of the wafer carrier 20, 40 relative to the wafer handling robot 12.

The already mentioned wafer boat 20, wafer cassette 40, and intermediate wafer storage may all be examples of wafer carriers having substantially horizontal wafer slots 46. With latest embodiment described hereabove, it may be possible to determine the exact position of the wafer carrier 20, 40, e.g. the exact position of the two front rails 22 and optionally the back rail 64 of a wafer boat 20 without knowing yet at which vertical level the wafer slots are positioned.

In a further embodiment, after calibrating the wafer handling robot 12 relative to the wafer carrier 20, 40 in the horizontal plane, a vertical level 56 of a first wafer slot 46 may be determined by means of the following:

vi) placing a wafer 80 in a start position 48 on the wafer support surface 16 of the end effector 14 such that the wafer 80 can be displaced over the wafer support surface 16 when a lateral force is exerted on the wafer 80;

vii) moving the end effector 14 with the wafer 80 to the wafer center finder 18 and determine with the wafer center finder 18 a determined position 50 of the wafer 80 relative to the end effector 14;

viii) moving the end effector 14 with the wafer 80 placed on it to a vertical level 58 in which is slightly below an estimated vertical level 56 of a first wafer slot 46 while the end effector 14 is horizontally spaced apart from the wafer carrier 20, 40;

ix) repeating the following vertical calibration cycle of steps e) to g) until the vertical level 56 of the first wafer slot 46 is determined:

e) move the end effector 14 with the wafer 80 on its wafer support surface 16 along the movement path 38 with the first calibrated entry angle 30 beyond the first calibrated end position 34;

f) move the end effector 14 with the wafer 80 on it to the wafer center finder 18 and determine with the wafer center finder 18 the position 50 of the wafer 80 relative to the end effector 14; and g) check whether, due to the movement of the end effector 14 along the movement path 38 beyond the first calibrated end position 34, the position 48, 50 of the wafer 80 relative to the end effector 14 has been displaced, wherein, if the wafer 80 has been displaced, the end effector 14 with the wafer 80 placed on it is moved over an incremental vertical distance to a vertical level 58 which is slightly higher than the previous vertical level 58 of the end effector 14 and subsequently repeat the vertical calibration cycle of steps e) to g), and wherein, if the wafer 80 has not been displaced, the method is continued at x);

x) storing a vertical level 58 for the end effector 14 which is slightly higher than the vertical level 58 which has been established in the last vertical calibration cycle in the system memory 26 as a first calibrated vertical level 60 of the first wafer slot 46.

Figure 11:
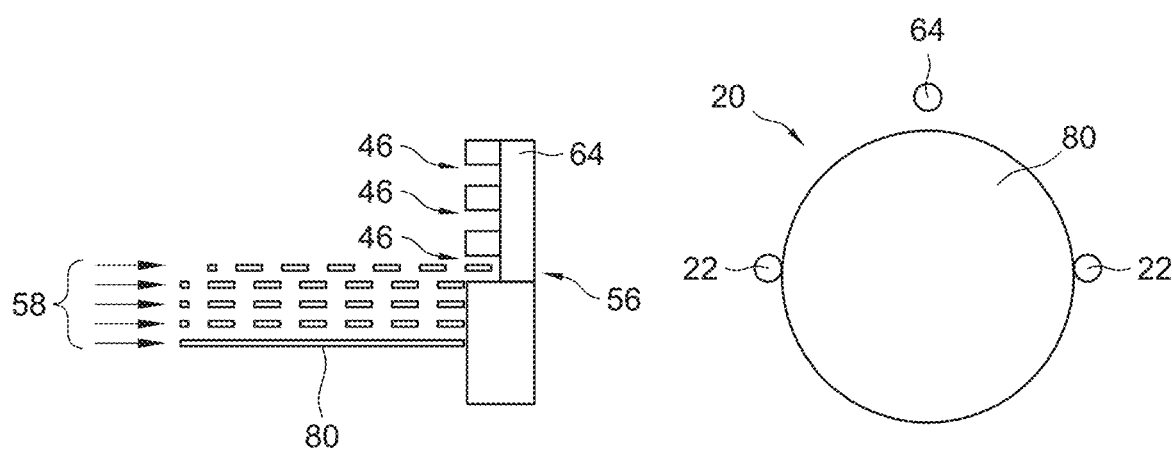
FIG. 11 shows a schematic top and side view of a wafer and a wafer carrier, in which the wafer abuts the wafer carrier below a wafer slot.
Figure 12:
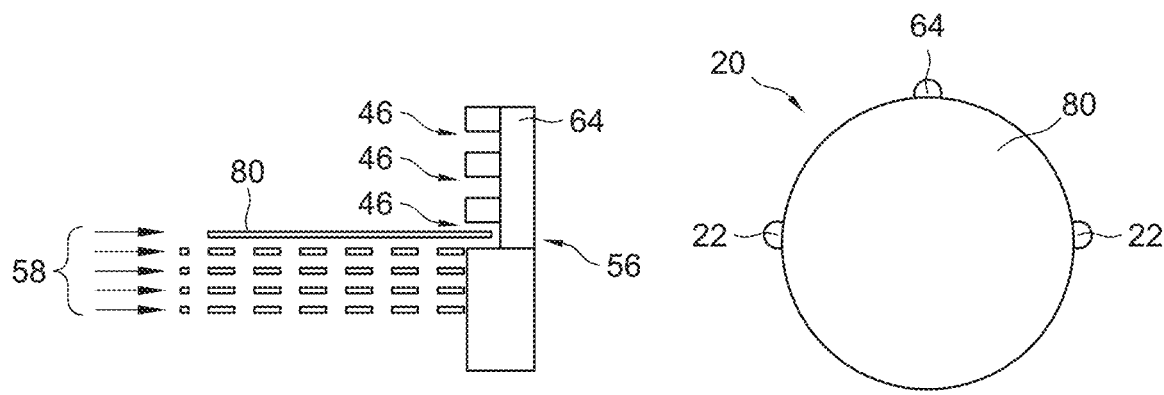
FIG. 12 shows a schematic top and side view of a wafer and a wafer carrier, in which the wafer extends into the wafer slot

As described above, the calibration cycle steps a) to d) in the horizontal plane may be used to determine the exact horizontal position of the wafer carrier 20, 40 relative to the wafer handling robot 12. These steps may e.g. be used to determine the exact position of the two front rails 22 of a wafer boat 20 relative to the wafer handling robot 12. The steps of e) to g) may subsequently be used to determine the exact vertical position of the first wafer slot 46 relative to the wafer handling robot 12. The method may start with the end effector 14 at a vertical level 58 in which the wafer 80 is at a vertical level below the first wafer slot 46, as schematically shown in FIG. 11. Since there may be no wafer slot 46 for the wafer 80 to slide into, the wafer 80 may abut the wafer carrier 20, 40. This may cause the wafer 80 to move over the wafer support surface 16 with respect to the end effector 14. This new position, and thus the movement, may be detected by the wafer center finder 18. In the next calibration cycle of steps e) to g) the end effector 14 may be moved along the first calibrated movement path 38 at a slightly higher vertical level 58. These steps may be continued until no displacement of the wafer 80 is measured from which it may be concluded that the wafer 80 has entered the first slot 46 and is at substantially the same vertical level as the first wafer slot 46. In this vertical level 58, the wafer 80 may slide into the first wafer slot 46, as is schematically shown in FIG. 12.

In an embodiment, when step g) is performed and it is established that a subsequent vertical calibration cycle has to be performed, the method may comprise before the next vertical calibration cycle of steps e) to g) is performed, repositioning the wafer 80 on the end effector 14 in the start position 48, and moving the end effector 14 with the wafer 80 to the wafer center finder 18 to determine with the wafer center finder 18 a determined position 50 of the wafer 80 relative to the end effector 14.

By repositioning the wafer 80 after each vertical calibration cycle into the start position 48, it may be prevented that the wafer 80 may be displaced too far from the center of the end effector 14 due to the superimposed displacements in the plurality of subsequent vertical calibration cycles.

In an embodiment, after the first calibrated vertical level 60 has been stored in the system memory 26, steps ii), iii), iv) a) to e), and step v) may be repeated, wherein the calibrated end position 34, 35 established during that repetition is a second calibrated end 35 position and the calibrated entry angle 30, 31 is a second calibrated entry angle 31 which are related to the exact position of the first wafer slot 46 relative to the wafer handling robot 12.

Figure 13:
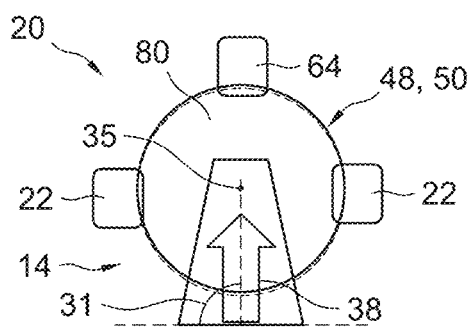
FIGS. 13 and 14 show a schematic top view of a wafer carrier and an end effector with a wafer on its wafer support surface according to the description, which end effector is moving toward the wafer carrier along different movement paths.
Figure 14:
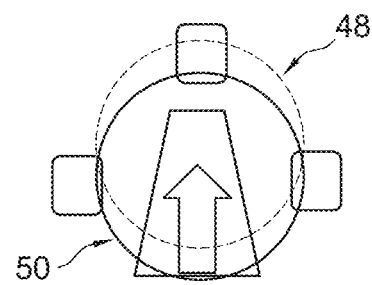

The above mentioned first calibrated end position 34, of which an example is shown in FIG. 9, may relate to the exact position of the wafer carrier 20, 40 relative to the wafer handling robot 12. The second calibrated end position 36, of which an example is shown in FIG. 13, may relate to the exact position of the first wafer slot 46 relative to the wafer handling robot 12. The second calibrated end position 36 may thus be a more finetuned position with respect to the wafer handling robot 12 of where to place a wafer 80. The first calibrated end position 34 may be calibrated at a vertical height at which no wafer slot 46 is present. The wafer 80 may then bump onto the wafer carrier 20, 40. This may e.g. be the two front rails 22 of a wafer boat 20 as shown in FIG. 11. With the determining of the second calibrated end position 36, the wafer 80 may be placed entirely in the first wafer slot 46. This may mean that e.g. the wafer 80 may reach the back rail 64 of a wafer boat 20 as shown in FIG. 13. FIG. 14 shows an example of a movement path 36 which extends beyond the second calibrated movement path 38 so as to be able to check whether the magnitude of the displacement of the wafer 80 relative to the end effector 14 meets the set end criterion.

In an embodiment the end effector 14 may have a vacuum clamp including a vacuum plenum in the wafer support surface 16. The vacuum plenum may be connectable to a vacuum source. The vacuum clamp can be switched on so as to connect the vacuum plenum with the vacuum source and can be switched off so that the vacuum plenum is disconnected from the vacuum source. For calibrating the vertical position 58 of the wafer handling robot 12 relative to a wafer 80 in the wafer carrier 20, 40 the method may comprise:

xi placing a wafer 80 in the first wafer slot 46 of the wafer carrier 20, 40;

xii performing the following steps automatically under control of the electronic controller 24 of the semiconductor processing assembly 10:

moving the end effector 14 to a start vertical level 58 which is below the first calibrated vertical level 60 and below the wafer 80 in the first wafer slot 46;

subsequently moving the end effector 14 in an upwards direction while vacuum clamp is switched on while measuring a pressure in the vacuum plenum or in a line connecting the vacuum plenum with the vacuum source; and, determining a vertical level 58 of the end effector 14 as soon as the pressure being measured drops and store this vertical level 58 as a second calibrated vertical level 62 of the end effector 14 relative to the respective wafer carrier 20, 40 in the system memory 26.

After having first determined the first calibrated vertical level 60 of the first wafer slot 46, the present embodiment may further finetune determination of the vertical level of the first wafer slot 46 by measuring the vertical level at which sudden pressure drop in the vacuum plenum occurs when the wafer 80 in the first wafer slot 46 is contacted by the wafer support surface 16 of the upwardly moving end effector 14. The vacuum clamp may be used to clamp a wafer 80 to the end effector 14, while the end effector 14 moves said wafer 80. During normal operation this may be beneficiary to securely fasten the wafer 80 to the end effector 14 while moving swiftly. During the calibration cycles in this description the vacuum clamp may be switched off, so that the wafer 80 may be displaced freely over the wafer support surface 16 of the end effector 14 when the wafer bumps against the wafer carrier 20, 40. However, during the fine tuning measurement of this embodiment for determining the exact vertical level of a wafer slot, the vacuum claim may be switched on. In this embodiment, the first wafer slot 46 may not necessarily be the top or bottom wafer slot 46 of the wafer slots 46 in the wafer carrier 20, 40, it may be any one of the wafer slots 46.

In an embodiment, the repositioning the wafer 80 on the end effector 14 in the start position may comprise pushing the wafer 80 into a wafer slot 46 within the semiconductor processing assembly 10 with a horizontal position and a vertical level 56 which are known relative to the wafer handling robot 12.

By pushing the wafer 80 into a wafer slot 46 of which the horizontal position and the vertical level 56 are known relative to the wafer handling robot 12, the wafer handling robot 12 may be able to exactly place the wafer 80 on a known position on the end effector 14, e.g. in the start position mentioned before. From that known position each displacement due to the movement in one of the calibration cycles may be related to that known position. The wafer slot 46 may be a wafer slot 46 in the wafer carrier 20, 40. The position and the vertical level 56 relative to the wafer handling robot 12 may be known from a previous calibration. The wafer slot 46 with the known horizontal position and the known vertical level 56 may be in a fixed position relative to the wafer handling robot. It may e.g. be unmovably arranged in the semiconductor processing assembly 10. It may e.g. be a slot in a wafer rack, or intermediate wafer storage which has a fixed position within the semiconductor processing assembly 10. In that way, once calibrated, the exact position of that wafer slot 46 may be known.

In an embodiment, during the subsequent horizontal calibration cycles, the defined entry angle 28 of the movement path 36 and the defined end position 32 of the movement path 36 of the end effector 14 may be incrementally varied so as to converge to the calibrated entry angle 30, 31 and the calibrated end position 34, 35 of the calibrated movement path 38 during looping through the calibration cycles. The incremental variation of the defined end position 32 in subsequent calibration cycles may comprise a distance variation of 3-5 mm between subsequent calibration cycles.

Each subsequent defined end position 32 may be closer to the calibrated end position 34, 35 than the defined end position 32 of the previous calibration cycle. The difference between two subsequent defined end position 32 may be not to great, because a too great difference may risk a too great movement of the wafer 80 over the wafer support surface 16 of the end effector 14 and may thus risk the wafer 80 falling of the end effector 14.

Figure 1:
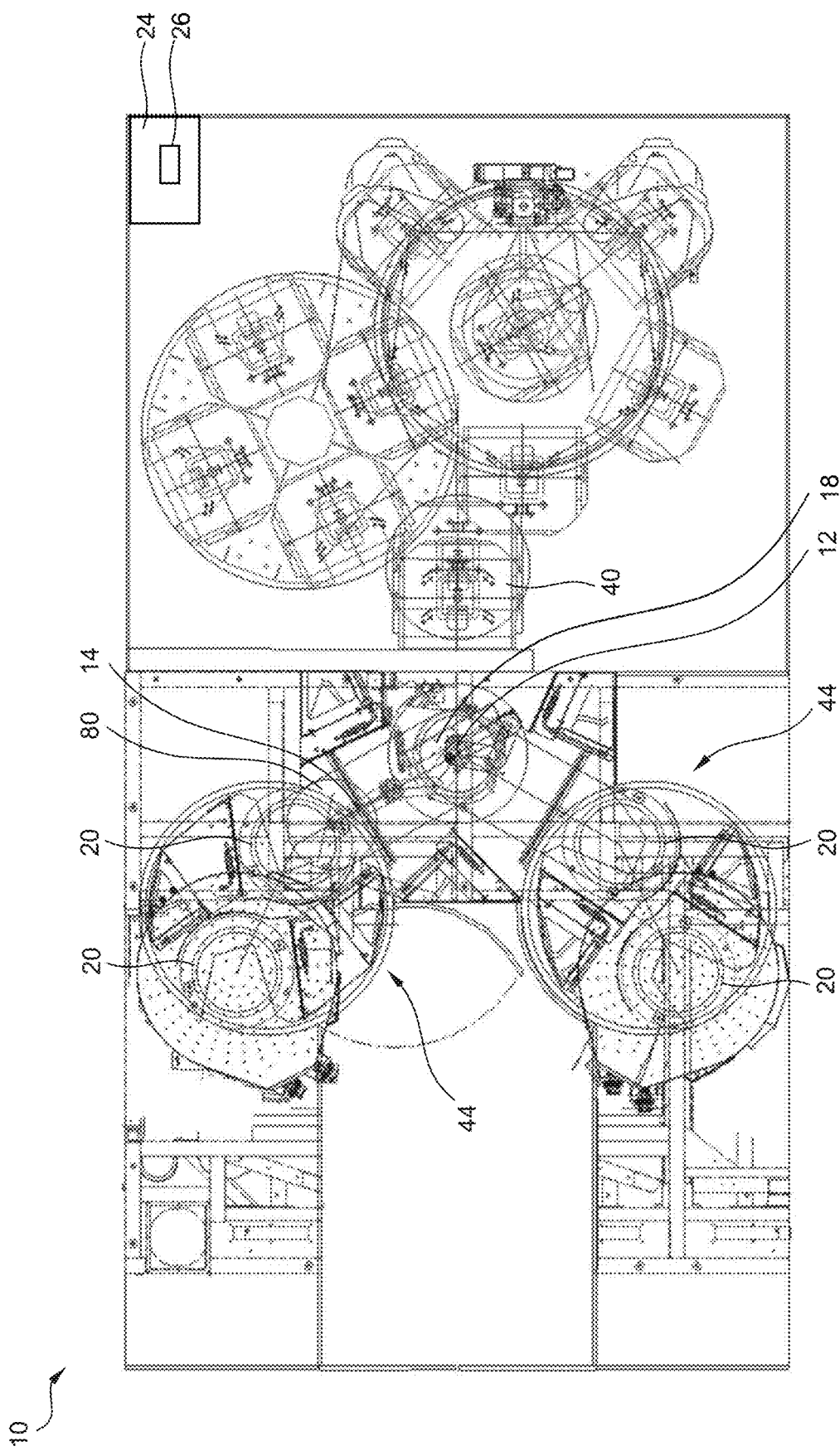
FIG. 1 shows a schematic top view of an example of an semiconductor processing assembly according to the description.

The present disclosure may also provide a semiconductor processing assembly 10, of which an example is shown in FIG. 1. The semiconductor processing assembly 10 may comprise a wafer handling robot 12 having an end effector 14 having a wafer support surface 16 configured to carry a wafer 80;

a wafer center finder 18 configured to determine a center of a wafer 80 which is placed on the end effector 14;

a wafer carrier 20, 40 relative to which the position of the wafer handling robot 12 has to be calibrated, the wafer carrier 20, 40 having wafer slots 46; and, an electronic controller 24 for controlling at least the wafer handling robot 12 and the wafer center finder 18 and having a system memory 26;

For calibrating the wafer handling robot 12 relative to the wafer carrier 20, 40 in a horizontal plane, the electronic controller 24 may be configured and programmed with a program in its system memory to control the semiconductor processing assembly 10 to automatically:

i) place a wafer 80 in a start position 48 on the wafer support surface 16 of the end effector 14 such that the wafer 80 can be displaced over the wafer support surface 16 when a lateral force is exerted on the wafer 80;

ii) move the end effector 14 with the wafer 80 to the wafer center finder 18 and determine with the wafer center finder 18 a determined position 50 of the wafer 80 relative to the end effector 14;

iii) repeat the following horizontal calibration cycle of steps a) to d) until a set end criterion is met at least a number of cycles:

a) determine on the basis of the determined position 50 of the wafer 80 relative to the end effector 14 a defined entry angle 28 of a movement path 36 and a defined end position 32 of the movement path 36 of the end effector 14, wherein the defined end position 32 is adjacent the wafer carrier 20, 40;

b) move the end effector 14 with the wafer 80 on its wafer support surface 16 to the defined end position 32 along the movement path 36 with the defined entry angle 28;

c) determine with the wafer center finder 18 the position 50 of the wafer 80 relative to the end effector 14; and d) check whether, due to the movement of the end effector 14 along the movement path 36 to the defined end position 32, the position 50 of the wafer 80 relative to the end effector 14 has been displaced and whether a magnitude of the displacement meets the set end criterion, wherein, if the magnitude does not meet the set criterion, a subsequent cycle of steps a) to d) is performed, and wherein, if the magnitude does meet the set criterion at least a number of cycles, the method is continued at iv);

iv) store the entry angle 28 and the end position 32 which has been determined in the last cycle in the system memory 26 as calibrated entry angle 30, 31 and calibrated end position 34, 35 for a calibrated movement path 38 of the wafer handling robot 12 relative to the respective wafer carrier 20, 40.

The semiconductor processing assembly 10 may be able to swiftly and reliably calibrate the position of the wafer handling robot 12 relative to the wafer carrier 20, 40 automatically. There may be no need for manual calibration. This may not only decrease the time needed for calibration, but may also increase the accuracy of the calibration.

Further effects and advantages of the semiconductor processing assembly 10 according to the description may be similar to the effects and advantages described above in relation to the method according the description. These effects and advantages are inserted here by reference.

In an embodiment the wafer carrier 20, 40 may comprise a wafer boat 20, a wafer cassette 40, and/or an intermediate wafer storage.

A wafer boat 20, a wafer cassette 40, and an intermediate wafer storage may all be examples of wafer carriers 20, 40 having substantially horizontal wafer slots 46. The electronic controller 24 of the semiconductor processing assembly 10 may be able to calibrate the wafer handling robot 12 relative to each or any one of them.

In an embodiment the semiconductor processing assembly 10 may further comprise a plurality of wafer carriers 20, 40 embodied as wafer boats 20. The wafer boats 20 may each be moveable to a wafer loading position 44 in which wafers 80 can be loaded by the wafer handling robot 12 in the respective wafer boat 20. The electronic controller 24 may be configured to control the semiconductor processing assembly 10 to perform steps i), ii), iii) a)-d), and iv) for each wafer boat 20 when it is positioned in the wafer loading position 44 so as to calibrate the wafer handling robot 12 to know the position with respect to each one of the plurality of wafer boats 20 when it is positioned in the wafer loading position 44.

The semiconductor processing assembly 10 may e.g. comprise four wafer boats 20 as shown in the example of FIG. 1. The four wafer boats may all be calibrated after each other. In that way the time advantage is the cumulative of the four calibrations.

In an embodiment the electronic controller 24 may be configured to, after calibrating the wafer handling robot 12 relative to the wafer carrier 20, 40 in the horizontal plane, determine a vertical level 56 of a first wafer slot 46 in the wafer carrier 20, 40 by means of the following:

v) placing a wafer 80 in a start position 48 on the wafer support surface 16 of the end effector 14 such that the wafer 80 can be displaced over the wafer support surface 16 when a lateral force is exerted on the wafer 80;

vi) moving the end effector 14 with the wafer 80 to the wafer center finder 18 and determine with the wafer center finder 18 a determined position 50 of the wafer 80 relative to the end effector 14;

vii) moving the end effector 14 with the wafer 80 placed on it to a vertical level 58 in which is slightly below an estimated level 56 of a first wafer slot 46 while the end effector 14 is horizontally spaced apart from the wafer carrier 20, 40; vii) repeating the following vertical calibration cycle of steps e) to g) until the vertical level 56 of the first wafer slot 46 is determined:

e) move the end effector 14 with the wafer 80 on its wafer support surface 16 along the movement path 36 with the first calibrated entry angle 28 beyond the first calibrated end position 32;

f) move the end effector 14 with the wafer 80 on it to the wafer center finder 18 and determine with the wafer center finder 18 the position 50 of the wafer 80 relative to the end effector 14; and, g) check whether, due to the movement of the end effector 14 along the movement path 36 beyond the first calibrated end position 32, the position 48, 50 of the wafer 80 relative to the end effector 14 has been displaced, wherein, if the wafer has been displaced, the end effector 14 with the wafer 80 placed on it is moved over an incremental vertical distance to a vertical level 58 which is slightly higher than the previous vertical level 58 of the end effector 14 and subsequently repeat the vertical calibration cycle of steps e) to g), and wherein, if the wafer 80 has not been displaced, the method is continued at ix);

ix) storing a vertical level 58 for the end effector 14 which is slightly higher than the vertical level 58 which has been established in the last vertical calibration cycle in the system memory 26 as a first calibrated vertical level 60 of the first wafer slot 46.

As described above, the calibration cycle steps a) to d) in the horizontal plane, may be used to determine the exact horizontal position of the wafer carrier 20, 40 relative to the wafer handling robot 12. These steps may e.g. be used to determine the exact position of the two front rails 22 of a wafer boat 20 relative to the wafer handling robot 12. The steps of e) to g) may subsequently be used to determine the exact vertical position of the first wafer slot 46 relative to the wafer handling robot 12. The method may start with the end effector 14 at a vertical level 58 in which the wafer 80 is at a vertical level below the first wafer slot 46, as schematically shown in FIG. 11. Since there may be no wafer slot 46 for the wafer 80 to slide into, the wafer 80 may abut the wafer carrier 20, 40. This may cause the wafer 80 to move over the wafer support surface 16 with respect to the end effector 14. This new position, and thus the movement, may be detected by the wafer center finder 18. In the next calibration cycle of steps a) to d) the end effector 14 may be moved along the first calibrated movement path 38 at a slightly higher vertical level 58. These steps may be continued until no displacement of the wafer 80 is measured from which it may be concluded that the wafer 80 has entered the first slot 46 and is at substantially the same vertical level as the first wafer slot 46. In this vertical level 58, the wafer 80 may slide into the first wafer slot 46, as is schematically shown in FIG. 12.

In an embodiment the end effector 14 may have a vacuum clamp including a vacuum plenum in the wafer support surface 16. The vacuum plenum may be connectable to a vacuum source. The vacuum clamp can be switched on so as to connect the vacuum plenum with the vacuum source and can be switched off so that the vacuum plenum is disconnected from the vacuum source. For calibrating the vertical position 58 of the wafer handling robot 12 relative to the wafer carrier 20, 40 a wafer 80 may be placed in a first wafer slot 46 in the wafer carrier 20, 40. The electronic controller 24 may be configured to control the semiconductor processing assembly 10 to automatically perform the following steps:
- moving the end effector 14 to a start vertical level 58 which is below the first calibrated vertical level 60 and below the wafer 80 in the first wafer slot 46;
- subsequently moving the end effector 14 in an upwards direction while vacuum clamp is switched on while measuring a pressure in the vacuum plenum or in a line connecting the vacuum plenum with the vacuum source; and,
- determining a vertical level 58 of the end effector 14 as soon as the pressure being measured drops and store this vertical level 58 as a second calibrated vertical level 62 of the wafer handling robot 12 relative to the respective wafer carrier 20, 40 in the system memory 26.

After having first determined the first calibrated vertical level 60 of the first wafer slot 46, the electronic controller 24 in the present embodiment may further finetune determination of the vertical level of the first wafer slot 46 by measuring the vertical level at which sudden pressure drop in the vacuum plenum occurs when the wafer 80 in the first wafer slot 46 is contacted by the wafer support surface 16 of the upwardly moving end effector 14. The vacuum clamp may be used to clamp a wafer 80 to the end effector 14, while the end effector 14 moves said wafer 80. During normal operation this may be beneficiary to securely fasten the wafer 80 to the end effector 14 while moving swiftly. During the calibration cycles in this description the vacuum clamp may be switched off, so that the wafer 80 may be displaced freely over the wafer support surface 16 of the end effector 14 when the wafer 80 bumps against the wafer carrier 20, 40. In this embodiment, the first wafer slot 46 may not necessarily be the top or bottom wafer slot 46 of the wafer slots 46 in the wafer carrier 20, 40, it may be any one of the wafer slots 46.

In an embodiment, the semiconductor processing assembly 10 may comprise a wafer slot 46 of which a horizontal position and a vertical level 56 are known relative to the wafer handling robot 12. The electronic controller 24 may be configured to control the wafer handling robot 12 to reposition the wafer 80 on the end effector 14 in the start position 48 by pushing the wafer 80 into the wafer slot 46 of which the horizontal position and the vertical level 56 are known relative to the wafer handling robot 12 before each calibration cycle.

By pushing the wafer 80 into a wafer slot 46 of which the horizontal position and the vertical level 56 are known relative to the wafer handling robot 12, the wafer handling robot 12 may be able to exactly place the wafer 80 on a known position on the end effector 14, e.g. in the start position mentioned before. From that known position all displacement due to the movement in one of the calibration cycles may be related to that known position. The wafer slot 46 may be a wafer slot 46 in the wafer carrier 20, 40. The position and the vertical level 56 relative to the wafer handling robot 12 may be known from a previous calibration. The wafer slot 46 with the known position and the known vertical level 56 may be in a fixed position relative to the wafer handling robot. It may e.g. be unmovably arranged in the semiconductor processing assembly 10. It may e.g. be a slot in a wafer rack, or intermediate wafer storage which has a fixed position within the semiconductor processing assembly 10. In that way, once calibrated, the exact position of the wafer slot 46 may be known.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this description are not necessarily all referring to the same embodiment.

Furthermore, it is noted that particular features, structures, or characteristics of one or more of the various embodiments which are described above may be used implemented independently from one another and may be combined in any suitable manner to form new, not explicitly described embodiments. The reference numbers used in the detailed description and the claims do not limit the description of the embodiments, nor do they limit the claims. The reference numbers are solely used to clarify.

LEGEND

10—semiconductor processing assembly
12—wafer handling robot
14—end effector
16—wafer support surface
18—wafer center finder
20—wafer boat
22—front rail (of wafer boat)
24—electronic controller
26—system memory 28—defined entry angle (of determined movement path of end effector)
30—first calibrated entry angle (of calibrated movement path of end effector)
31—second calibrated entry angle (of calibrated movement path of end effector)
32—defined end position (of determined movement path of end effector)
34—first calibrated end position (of calibrated movement path of end effector)
35—first calibrated end position (of calibrated movement path of end effector)
36—defined movement path (of end effector)
38—calibrated movement path (of end effector)
40—wafer cassette
44—wafer loading position
46—wafer slot
48—start position (of wafer on end effector)
50—determined position (of wafer on end effector)
56—vertical level (of a wafer slot)
58—vertical level (of end effector)
60—first calibrated vertical level (of end effector)
62—second calibrated vertical level (of end effector)
64—back rail (of wafer boat)
80—wafer

The invention claimed is:

1. Method for automatically calibrating the position of a wafer handling robot relative to a wafer carrier, the method comprising:
   i) providing a semiconductor processing assembly comprising:
      a wafer handling robot having an end effector having a wafer support surface configured to carry a wafer;
      a wafer center finder configured to determine the center of a wafer which is placed on the end effector;
      a wafer carrier relative to which the position of the wafer handling robot has to be calibrated, the wafer carrier having wafer slots; and,
      an electronic controller for controlling at least the wafer handling robot and the wafer center finder and having a system memory;
   wherein for calibrating the wafer handling robot relative to the wafer carrier in a horizontal plane, the following method steps are automatically performed under control of the electronic controller of the semiconductor processing assembly:
   ii) placing a wafer in a start position on the wafer support surface of the end effector such that the wafer can be displaced over the wafer support surface when a lateral force is exerted on the wafer;
   iii) moving the end effector with the wafer to the wafer center finder and determine with the wafer center finder a determined position of the wafer relative to the end effector;
   iv) repeating the following horizontal calibration cycle of steps a) to d) until a set end criterion is met at least a number of cycles:
      a) determine on the basis of the determined position of the wafer relative to the end effector a defined entry angle of a movement path and a defined end position of the movement path of the end effector, wherein the defined end position is adjacent the wafer carrier;
      b) move the end effector with the wafer on its wafer support surface to the defined end position along the movement path with the defined entry angle;
      c) determine with the wafer center finder the position of the wafer relative to the end effector; and,
      d) check whether, due to the movement of the end effector along the movement path to the defined end position, the position of the wafer relative to the end effector has been displaced and whether a magnitude of the displacement meets the set end criterion, wherein, if the magnitude does not meet the set criterion, a subsequent cycle of steps a) to d) is performed, and wherein, if the magnitude does meet the set criterion at least a number of cycles, the method is continued at v);
   v) storing the entry angle and the end position which has been determined in the last cycle in the system memory as calibrated entry angle and calibrated end position for a calibrated movement path of the wafer handling robot relative to the respective wafer carrier.

2. The method according to claim 1, wherein when step d) is performed and it is established that a subsequent horizontal calibration cycle has to be performed, the method comprises before the next horizontal calibration cycle of steps a) to d) is performed:
   repositioning the wafer on the end effector in the start position and,
   moving the end effector with the wafer to the wafer center finder to determine with the wafer center finder a determined position of the wafer relative to the end effector.

3. The method according to claim 1, wherein the wafer slots of the wafer carrier are substantially horizontal, wherein the defined end position of the movement path adjacent the wafer carrier is at a vertical level of the wafer carrier wherein no wafer slots are present and wherein the calibrated end position is a first calibrated end position and the calibrated entry angle is a first calibrated entry angle which are related to the exact position of the wafer carrier relative to the wafer handling robot.

4. The method according to claim 3, wherein, after calibrating the wafer handling robot relative to the wafer carrier in the horizontal plane, a vertical level of a first wafer slot is determined by means of the following:
   vi) placing a wafer in a start position on the wafer support surface of the end effector such that the wafer can be displaced over the wafer support surface when a lateral force is exerted on the wafer;
   vii) moving the end effector with the wafer to the wafer center finder and determine with the wafer center finder a determined position of the wafer relative to the end effector;
   viii) moving the end effector with the wafer placed on it to a vertical level in which is slightly below an estimated vertical level of a first wafer slot while the end effector is horizontally spaced apart from the wafer carrier;
   ix) repeating the following vertical calibration cycle until the vertical level of the first wafer slot is determined:
      e) move the end effector with the wafer on its wafer support surface along the movement path with the first calibrated entry angle beyond the first calibrated end position;
      f) move the end effector with the wafer on it to the wafer center finder and determine with the wafer center finder the position of the wafer relative to the end effector; and
      g) check whether, due to the movement of the end effector along the movement path beyond the first calibrated end position, the position of the wafer relative to the end effector has been displaced, wherein, if the wafer has been displaced, the end effector with the wafer placed on it is moved over an incremental vertical distance to a vertical level which is slightly higher than the previous vertical level of the end effector and subsequently repeat the vertical calibration cycle of steps e) to g), and wherein, if the wafer has not been displaced, the method is continued at x);

x) storing a vertical level for the end effector which is slightly higher than the vertical level which has been established in the last vertical calibration cycle in the system memory as a first calibrated vertical level of the first wafer slot.

5. The method according to claim 4, wherein when step g) is performed and it is established that a subsequent vertical calibration cycle has to be performed, the method comprises before the next vertical calibration cycle of steps e) to g) is performed:

repositioning the wafer is on the end effector in the start position; and, moving the end effector with the wafer to the wafer center finder to determine with the wafer center finder a determined position of the wafer relative to the end effector.

6. The method of claim 4, wherein after the first calibrated vertical level has been stored in the system memory, steps ii), iii), iv) a) to e), and step v) are repeated, wherein the calibrated end position established during that repetition is a second calibrated end position and the calibrated entry angle is a second calibrated entry angle which are related to the exact position of the first wafer slot relative to the wafer handling robot.

7. The method according to claim 4, wherein the end effector has a vacuum clamp including a vacuum plenum in the wafer support surface which vacuum plenum is connectable to a vacuum source, wherein the vacuum clamp can be switched on so as to connect the vacuum plenum with the vacuum source and can be switched off so that the vacuum plenum is disconnected from the vacuum source, wherein for calibrating the vertical position of the wafer handling robot relative to a wafer in the wafer carrier the method comprises:

xi) placing a wafer in the first wafer slot of the wafer carrier;

xii) performing the following steps automatically under control of the electronic controller of the semiconductor processing assembly:

moving the end effector to a start vertical level which is below the first calibrated vertical level and below the wafer in the first wafer slot;

subsequently moving the end effector in an upwards direction while vacuum clamp is switched on while measuring a pressure in the vacuum plenum or in a line connecting the vacuum plenum with the vacuum source; and, determining a vertical level of the end effector as soon as the pressure being measured drops and store this vertical level as a second calibrated vertical level of the end effector relative to the respective wafer carrier in the system memory.

8. The method of claim 2, wherein the repositioning comprises pushing the wafer into a wafer slot within the semiconductor processing assembly with a horizontal position and a vertical level which are known relative to the wafer handling robot.

9. The method according to claim 1, wherein during the subsequent horizontal calibration cycles the defined entry angle of the movement path and the defined end position of the movement path of the end effector are incrementally varied so as to converge to the calibrated entry angle and the calibrated end position of the calibrated movement path during looping through the calibration cycles.

10. The method according to claim 9, wherein the incremental variation of the defined end position in subsequent calibration cycles comprises a distance variation of 3-5 mm between subsequent calibration cycles.

11. A semiconductor processing assembly comprising:
a wafer handling robot having an end effector having a wafer support surface configured to carry a wafer;
a wafer center finder configured to determine a center of a wafer which is placed on the end effector;
a wafer carrier relative to which the position of the wafer handling robot has to be calibrated, the wafer carrier having wafer slots; and,
an electronic controller for controlling at least the wafer handling robot and the wafer center finder and having a system memory;
wherein for calibrating the wafer handling robot relative to the wafer carrier in a horizontal plane, the electronic controller is configured and programmed with a program in its system memory to control the semiconductor processing assembly to automatically:
i) place a wafer in a start position on the wafer support surface of the end effector such that the wafer can be displaced over the wafer support surface when a lateral force is exerted on the wafer;
ii) move the end effector with the wafer to the wafer center finder and determine with the wafer center finder a determined position of the wafer relative to the end effector;
iii) repeat the following horizontal calibration cycle of steps a) to d) until a set end criterion is met at least a number of cycles:
a) determine on the basis of the determined position of the wafer relative to the end effector a defined entry angle of a movement path and a defined end position of the movement path of the end effector, wherein the defined end position is adjacent the wafer carrier;
b) move the end effector with the wafer on its wafer support surface to the defined end position along the movement path with the defined entry angle;
c) determine with the wafer center finder the position of the wafer relative to the end effector; and
d) check whether, due to the movement of the end effector along the movement path to the defined end position, the position of the wafer relative to the end effector has been displaced and whether a magnitude of the displacement meets the set end criterion, wherein, if the magnitude does not meet the set criterion, a subsequent cycle of steps a) to d) is performed, and wherein, if the magnitude does meet the set criterion at least a number of cycles, the method is continued at iv);
iv) store the entry angle and the end position which has been determined in the last cycle in the system memory as calibrated entry angle and calibrated end position for a calibrated movement path of the wafer handling robot relative to the respective wafer carrier.

12. The semiconductor processing assembly according to claim 11, wherein the wafer carrier comprises a wafer boat, a wafer cassette, and/or an intermediate wafer storage.

13. The semiconductor processing assembly according to claim 11, further comprising:
a plurality of wafer carriers embodied as wafer boats, wherein the wafer boats are each moveable to a wafer loading position in which wafers can be loaded by the wafer handling robot in the respective wafer boat, wherein the electronic controller is configured and programmed with a program in its system memory to control the semiconductor processing assembly to perform steps i), ii), iii) a)-d), and iv) for each wafer boat when it is positioned in the wafer loading position so as to calibrate the wafer handling robot to know the position with respect to each one of the plurality of wafer boats when it is positioned in the wafer loading position.

14. The semiconductor processing assembly according to claim 11, wherein the electronic controller is configured and programmed with a program in its system memory to, after calibrating the wafer handling robot relative to the wafer carrier in the horizontal plane, determine a vertical level of a first wafer slot in the wafer carrier by means of the following:
  v) placing a wafer in a start position on the wafer support surface of the end effector such that the wafer can be displaced over the wafer support surface when a lateral force is exerted on the wafer;
  vi) moving the end effector with the wafer to the wafer center finder and determine with the wafer center finder a determined position of the wafer relative to the end effector;
  vii) moving the end effector with the wafer placed on it to a vertical level in which is slightly below an estimated level of a first wafer slot while the end effector is horizontally spaced apart from the wafer carrier;
  vii) repeating the following vertical calibration cycle of steps e) to g) until the vertical level of the first wafer slot is determined:
    e) move the end effector with the wafer on its wafer support surface along the movement path with the first calibrated entry angle beyond the first calibrated end position;
    f) move the end effector with the wafer on it to the wafer center finder and determine with the wafer center finder the position of the wafer relative to the end effector; and,
    g) check whether, due to the movement of the end effector along the movement path beyond the first calibrated end position, the position of the wafer relative to the end effector has been displaced, wherein, if the wafer has been displaced, the end effector with the wafer placed on it is moved over an incremental vertical distance to a vertical level which is slightly higher than the previous vertical level of the end effector and subsequently repeat the vertical calibration cycle of steps e) to g), and wherein, if the wafer has not been displaced, the method is continued at ix);
  ix) storing a vertical level for the end effector which is slightly higher than the vertical level which has been established in the last vertical calibration cycle in the system memory as a first calibrated vertical level of the first wafer slot.

15. The semiconductor processing assembly according to claim 14, wherein the end effector has a vacuum clamp including a vacuum plenum in the wafer support surface which vacuum plenum is connectable to a vacuum source, wherein the vacuum clamp can be switched on so as to connect the vacuum plenum with the vacuum source and can be switched off so that the vacuum plenum is disconnected from the vacuum source; wherein for calibrating the vertical position of the wafer handling robot relative to the wafer carrier a wafer is placed in a first wafer slot in the wafer carrier and wherein the electronic controller is configured and programmed with a program in its system memory to control the semiconductor processing assembly to automatically perform the following steps:
  moving the end effector to a start vertical level which is below the first calibrated vertical level and below the wafer in the first wafer slot;
  subsequently moving the end effector in an upwards direction while vacuum clamp is switched on while measuring a pressure in the vacuum plenum or in a line connecting the vacuum plenum with the vacuum source; and,
  determining a vertical level of the end effector as soon as the pressure being measured drops and store this vertical level as a second calibrated vertical level of the wafer handling robot relative to the respective wafer carrier in the system memory.

16. The semiconductor processing assembly according to claim 11, wherein the semiconductor processing assembly comprises a wafer slot of which a horizontal position and a vertical level are known relative to the wafer handling robot, wherein the electronic controller is configured and programmed with a program in its system memory to control the wafer handling robot to reposition the wafer on the end effector in the start position by pushing the wafer into the wafer slot of which the horizontal position and the vertical level are known relative to the wafer handling robot before each calibration cycle.

17. A programmable memory device provided with a program for automatically calibrating the wafer handling robot relative to a wafer carrier in a semiconductor processing assembly, wherein the program when run on an electronic controller of the semiconductor processing assembly makes the semiconductor processing assembly execute a method according to claim 1.

* * * * *